US010734601B2

(12) United States Patent
Choi

(10) Patent No.: US 10,734,601 B2
(45) Date of Patent: Aug. 4, 2020

(54) DISPLAY APPARATUS AND METHOD OF MANUFACTURING THE SAME

(71) Applicant: SAMSUNG DISPLAY CO., LTD., Yongin-si, Gyeonggi-do (KR)

(72) Inventor: Jungho Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 102 days.

(21) Appl. No.: 14/855,308

(22) Filed: Sep. 15, 2015

(65) Prior Publication Data

US 2016/0285042 A1 Sep. 29, 2016

(30) Foreign Application Priority Data

Mar. 27, 2015 (KR) ........................ 10-2015-0043302

(51) Int. Cl.
*H01L 27/32* (2006.01)
*H01L 51/52* (2006.01)

(52) U.S. Cl.
CPC .... *H01L 51/5246* (2013.01); *H01L 2251/566* (2013.01)

(58) Field of Classification Search
CPC ... H01L 27/32–326; H01L 51/50–5012; H01L 51/525–5287; H01L 2227/32–326; H01L 2251/5323–5361; H01L 2924/12044; H01L 2021/775; H01L 27/1214; H01L 27/124; H01L 27/3232; H01L 51/0076; H01L 27/14603; H01L 27/14605; H01L 27/14609; H01L 27/14812; H01L 27/3248; H01L 27/326
See application file for complete search history.

(56) References Cited

U.S. PATENT DOCUMENTS

| 2005/0045882 A1* | 3/2005 | Park | H01L 27/3244 257/59 |
| 2005/0184927 A1* | 8/2005 | Kwak | H01L 51/5246 345/45 |
| 2006/0170854 A1 | 8/2006 | Han et al. | |

(Continued)

FOREIGN PATENT DOCUMENTS

| KR | 10-2006-0088191 A | 8/2006 |
| KR | 10-2007-0052151 A | 5/2007 |

(Continued)

*Primary Examiner* — Cuong B Nguyen
*Assistant Examiner* — Samuel Park
(74) *Attorney, Agent, or Firm* — Lewis Roca Rothgerber Christie LLP

(57) ABSTRACT

One or more exemplary embodiments provide a display apparatus including a substrate; an encapsulation substrate facing the substrate; a display portion disposed between the substrate and the encapsulation substrate and including a display region; a metal layer disposed on the substrate and surrounding the display region; and a sealing portion formed to overlap the metal layer and coupling the substrate to the encapsulation substrate, wherein the metal layer includes a first region disposed outside of the display region at one side of the display region and a second region disposed outside of the display region at another side, which is opposite to the one side, of the display region, and the metal layer has a different light reflectivity in the first region and the second region.

11 Claims, 5 Drawing Sheets

(56) References Cited

U.S. PATENT DOCUMENTS

| | | |
|---|---|---|
| 2007/0108889 A1 | 5/2007 | Kim |
| 2011/0018142 A1* | 1/2011 | Kawamura ........... G02F 1/1345 257/776 |
| 2012/0012890 A1 | 1/2012 | Lee et al. |
| 2013/0137200 A1* | 5/2013 | Shimomura ........ H01L 51/5246 438/26 |
| 2014/0027743 A1 | 1/2014 | Nishido |
| 2014/0339510 A1 | 11/2014 | Lee et al. |

FOREIGN PATENT DOCUMENTS

| | | |
|---|---|---|
| KR | 10-2011-0041321 A | 4/2011 |
| KR | 10-2012-0007355 A | 1/2012 |
| KR | 10-2014-0016170 A | 2/2014 |

\* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2015-0043302, filed on Mar. 27, 2015, in the Korean Intellectual Property Office, the disclosure of which is incorporated herein in its entirety by reference.

BACKGROUND

1. Field

One or more exemplary embodiments relate to a display apparatus and a method of manufacturing the same.

2. Description of the Related Art

Recently, a display apparatus has been widely used for various purposes. This is particularly because thickness and weight of the display apparatus has been reduced. The display apparatus may be formed by various methods, for example, by disposing a display portion for displaying an image between a substrate and an encapsulation substrate. In this case, the substrate and the encapsulation substrate may be coupled by a sealing portion to prevent external air, humidity, and/or other impurities from infiltrating into the display portion.

SUMMARY

One or more aspects of one or more exemplary embodiments are directed toward a display apparatus and a method of manufacturing the same.

Additional aspects will be set forth in part in the description which follows and, in part, will be apparent from the description, or may be learned by practice of the presented embodiments.

According to one or more exemplary embodiments, a display apparatus includes a substrate; an encapsulation substrate facing the substrate; a display portion disposed between the substrate and the encapsulation substrate and having a display region that displays an image; a metal layer disposed on the substrate and surrounding the display region; and a sealing portion formed to overlap the metal layer and coupling the substrate to the encapsulation substrate; wherein the metal layer includes a first region disposed outside of the display region at one side of the display region and a second region disposed outside of the display region at another side of the display region, which is opposite to the one side, and the metal layer has a different light reflectivity in the first region and the second region.

In some embodiments, the metal layer includes a plurality of holes, and the number of holes per unit area differs in the first region and the second region.

In some embodiments, the display apparatus further includes an insulating layer between the metal layer and the sealing portion, wherein the insulating layer comprises a plurality of trenches formed to overlap the plurality of holes.

In some embodiments, the display apparatus further includes a second metal layer disposed on the first region or the second region.

In some embodiments, the second metal layer includes at least aluminum.

In some embodiments, the display portion includes a display device and a thin film transistor electrically connected to the display device, wherein the thin film transistor includes an active layer, a gate electrode, a source electrode and a drain electrode, and the second metal layer is formed of the same material as the source electrode and the drain electrode.

In some embodiments, the display device includes a first electrode, a second electrode, and an organic emission layer between the first electrode and the second electrode.

In some embodiments, the display portion includes a pad configured to apply an electrical signal to the display region, and the pad is disposed between the first region and the second region and outside the sealing portion.

In some embodiments, an effective width of the sealing portion in each of the first region and the second region differs.

According to one or more exemplary embodiments, a method of manufacturing a display apparatus includes preparing a first mother substrate and a second mother substrate facing the first mother substrate; forming a plurality of display portions including respective display regions and metal layers surrounding the respective display regions, on the first mother substrate; coupling the first mother substrate to the second mother substrate by utilizing a plurality of sealing portions formed to overlap the metal layers; and forming a plurality of display apparatuses by cutting the coupled first mother substrate and second mother substrate along a cutting line, wherein each of the metal layers includes a first region disposed outside of a corresponding display region of the display regions at one side of the corresponding display region and a second region disposed outside of the corresponding display region at another side, which is opposite to the one side, of the corresponding display region, and the each of the metal layers has a different light reflectivity in the first region and the second region.

In some embodiments, the each of the metal layers includes a plurality of holes, and the number of the plurality of holes per unit area for the first region is different from the number of the plurality of holes per unit area for the second region.

In some embodiments, the method further includes a second metal layer containing aluminum on the first region or the second region.

In some embodiments, each of the plurality of display portions includes a display device and a thin film transistor electrically connected to the display device; the thin film transistor includes an active layer, a gate electrode, a source electrode, and a drain electrode; and the second metal layer is made of the same material as the source electrode and the drain electrode.

In some embodiments, the display device includes a first electrode, a second electrode, and an organic emission layer between the first electrode and the second electrode.

In some embodiments, each of the plurality of sealing portions is formed in a closed curve, and the each of the plurality of sealing portion is formed by coating a primary sealing portion in a paste state on one surface of the first mother substrate or the second mother substrate, calcining and drying the primary sealing portion, and then melting and curing the primary sealing portion with a laser beam.

In some embodiments, the laser beam is irradiated to at least two adjacent sealing portions from among the plurality of sealing portions at the same time and in the same pattern, and when the laser beam is firstly irradiated to one region selected from the first region and the second region, a light reflectivity of the metal layer in the one region is greater than the light reflectivity of the metal layer in another region among the first region and the second region.

In some embodiments, the each of the plurality of sealing portions has an effective width in the one region, which is greater than the effective width in the other region.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
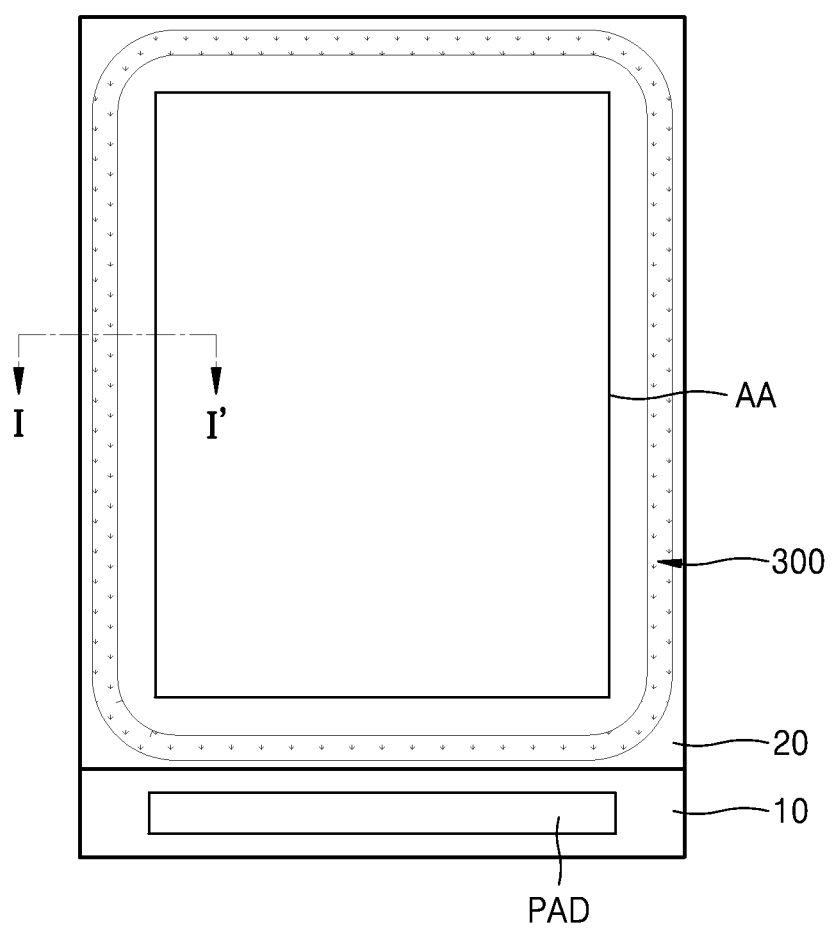
FIG. 1 is a schematic plan view of a display apparatus according to an exemplary embodiment.

As the invention allows for various changes and numerous embodiments, exemplary embodiments will be illustrated in the drawings and described in more detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms "one", "another one", "first", "second", "primary", "secondary", and the like, as used herein do not denote any order, quantity, or importance, but rather are used to distinguish one element from another.

The terminology used herein is for the purpose of describing exemplary embodiments only and is not intended to be limiting of exemplary embodiments. As used herein, the singular forms "a", "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Hereinafter, reference will now be made in more detail to exemplary embodiments, examples of which are illustrated in the accompanying drawings, wherein like reference numerals refer to like elements throughout.

Figure 2:
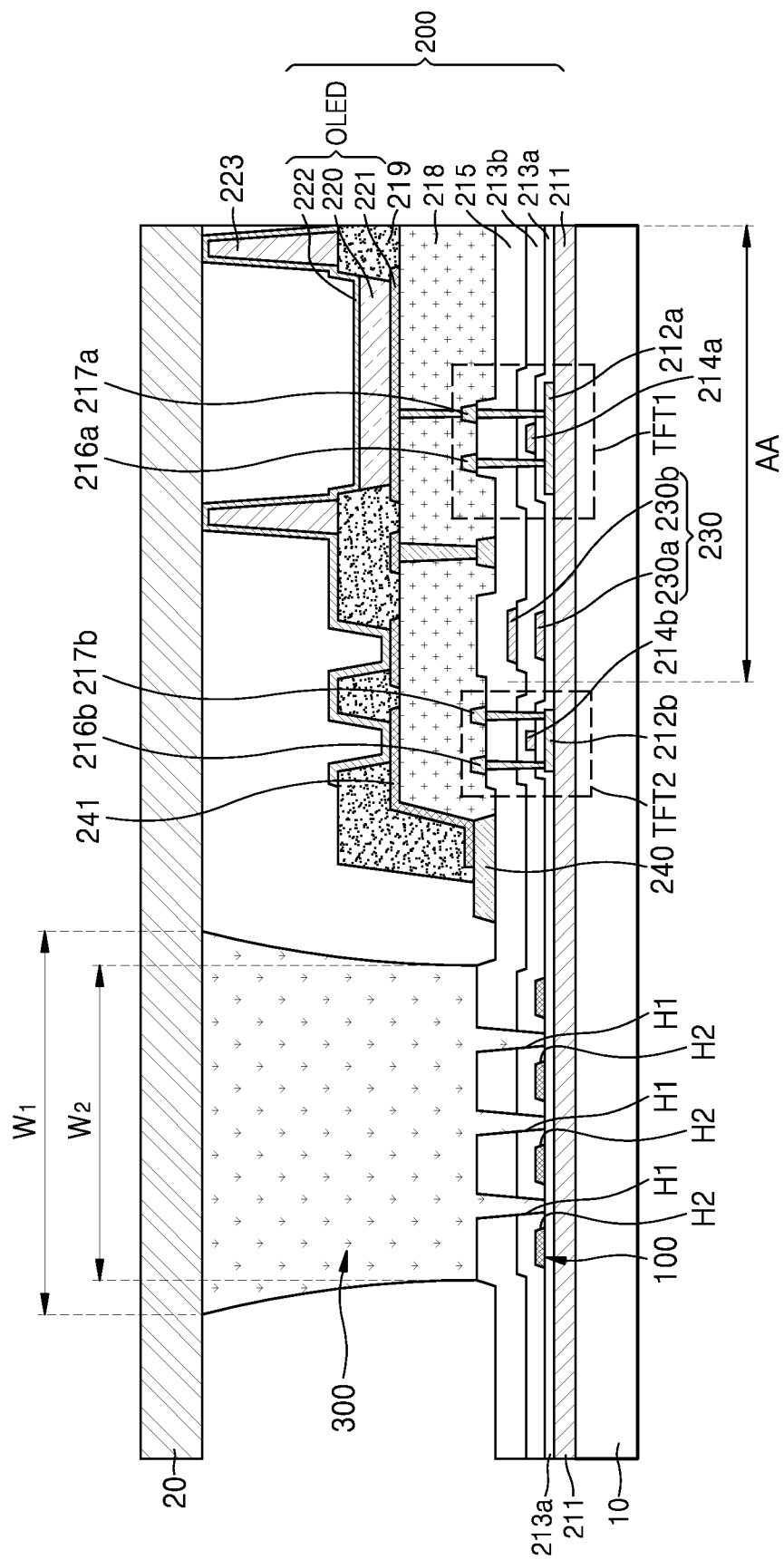
FIG. 2 is a schematic cross-sectional view, taken along a line I-I' of FIG. 1.
Figure 3:
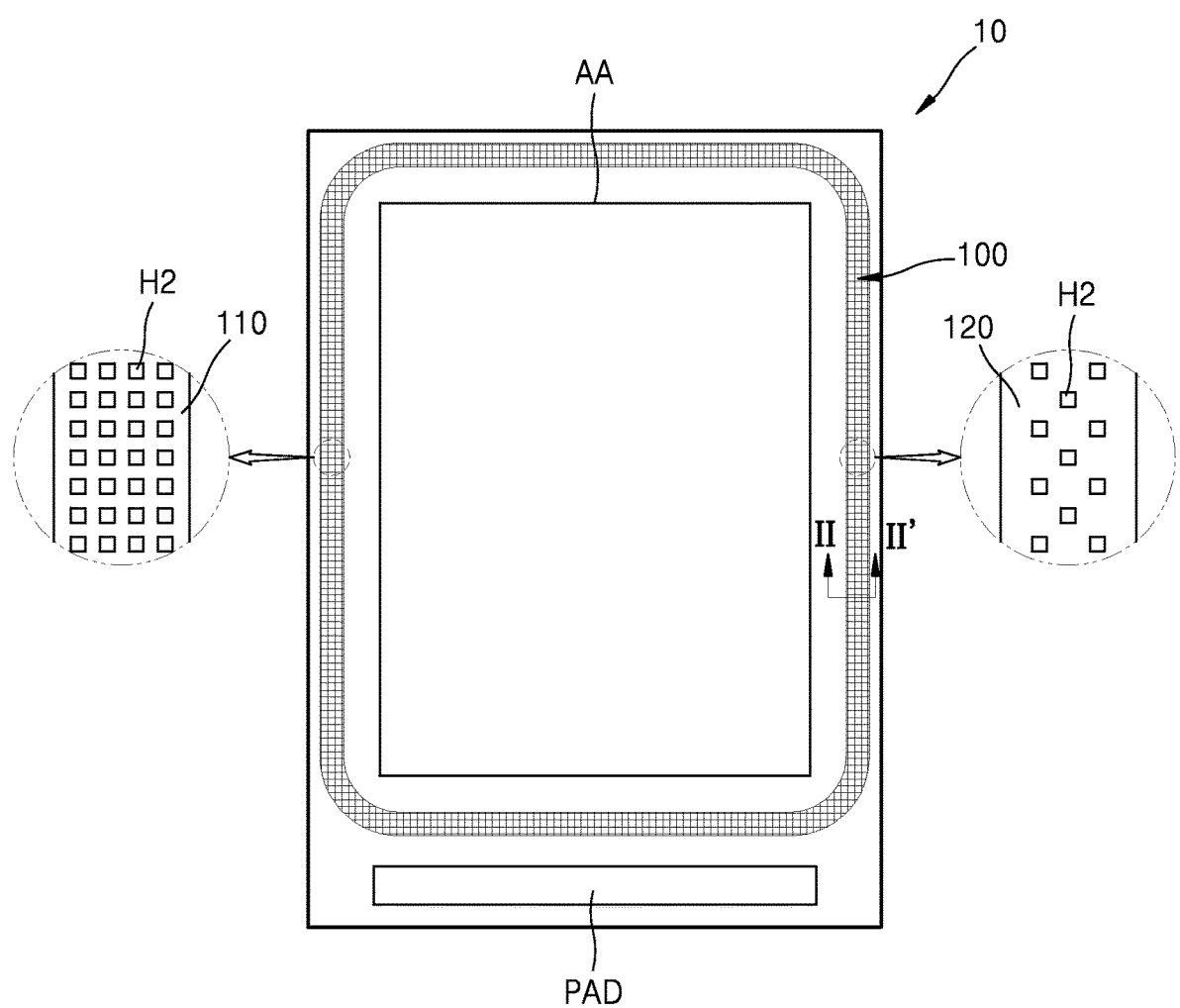
FIG. 3 is a schematic plan view of a substrate of the display apparatus in FIG. 1.
Figure 4:
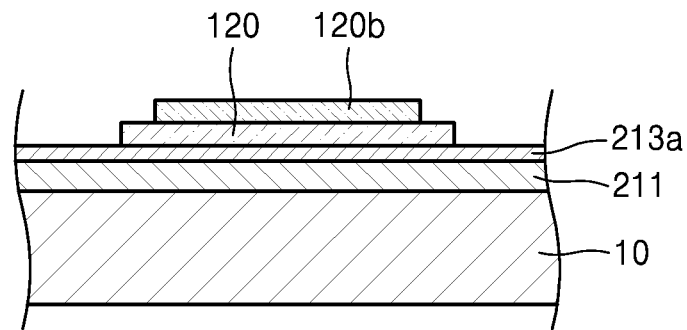
FIG. 4 is a schematic cross-sectional view, taken along a line II-II' of FIG. 3.

FIG. 1 is a schematic plan view of a display apparatus according to an exemplary embodiment; FIG. 2 is a schematic cross-sectional view, taken along a line I-I' of FIG. 1; FIG. 3 is a schematic plan view of a substrate of the display apparatus in FIG. 1; and FIG. 4 is a schematic cross-sectional view, taken along a line II-II' of FIG. 3.

Referring to FIGS. 1 to 4, an organic light-emitting display apparatus 1 according to an exemplary embodiment may include a substrate 10, an encapsulation substrate 20, a display portion 200 disposed between the substrate 10 and the encapsulation substrate 20, and a sealing portion 300 that is used to couple the substrate 10 to the encapsulation substrate 20.

The substrate 10 may be a solid glass substrate, a polymer substrate, a flexible film, a metal substrate, or a combination thereof. In some exemplary embodiments, the substrate 10 may be a flexible substrate and made of a plastic with excellent heat-resistance and durability.

The encapsulation substrate 20 is disposed to face the substrate 10. The encapsulation substrate 20 may be made of a transparent member. In this regard, an image displayed on the display portion 200 may be exposed to the outside through the encapsulation substrate 20. In some exemplary embodiments, the encapsulation substrate 20 may serve as a touch panel by further including an on-cell touch screen panel that has a touch screen pattern thereon. In some exemplary embodiments, a polarizing film (e.g., a Polaroid film), a color film, and/or a protection window may be further provided on the encapsulation substrate 20.

The display portion 200 is disposed between the substrate 10 and the encapsulation substrate 20. The display portion 200 provides an image that may be recognized by a user. FIG. 2 illustrates the display portion 200 including an organic light-emitting device OLED, but exemplary embodiments are not limited thereto. The display portion 200 may include a liquid crystal device or other display devices.

The display portion 200 formed on the substrate 10 may include a display region AA displaying an image, and a pad PAD may be disposed around the display region AA to transmit an electrical signal from a power supply apparatus or a signal generating apparatus to the display region AA. Hereinafter, the display portion 200 will be described in more detail with reference to FIG. 2.

A buffer layer 211 may be formed on the substrate 10. The buffer layer 211 may be formed on a whole surface of the substrate 10, that is, the buffer layer 211 may be formed both on the display region AA and on the perimeter of the display region AA. The buffer layer 211 may planarize the substrate 10 and prevent infiltration of impurities through the substrate 10. The buffer layer 211 may be made of silicon oxide, silicon nitride, and/or the like.

Insulating layers, a first thin film transistor TFT1, and a second thin film transistor TFT2 may be formed on the buffer layer 211. The insulating layers may include first and second gate insulating films 213a and 213b and an interlayer insulating layer 215.

The first thin film transistor TFT1 may include a first active layer 212a, a first gate electrode 214a, a first source electrode 216a, and a first drain electrode 217a. The first gate insulating film 213a is disposed between the first gate electrode 214a and the first active layer 212a to insulate the first gate electrode 214a from the first active layer 212a. The first gate electrode 214a is formed on the first active layer 212a with the first gate insulating film 213a therebetween. The first thin film transistor TFT1 may be a driving thin-film transistor that is electrically connected to and drives the organic light-emitting device OLED.

The second thin film transistor TFT2 may include a second active layer 212b, a second gate electrode 214b, a second source electrode 216b, and a second drain electrode 217b. The first gate insulating film 213a is disposed between the second gate electrode 214b and the second active layer 212b to insulate the second gate electrode 214b from the second active layer 212b. The second gate electrode 214b is formed on the second active layer 212b with the first gate insulating film 213a therebetween.

The first active layer 212a and the second active layer 212b may be formed on the buffer layer 211. The first active layer 212a and the second active layer 212b may be formed of an inorganic semiconductor (such as amorphous silicon or poly silicon) or an organic semiconductor. In some exemplary embodiments, the first active layer 212a may be formed of an oxide semiconductor. For example, the oxide semiconductor may include an oxide of a material selected from Group 12, 13, and 14 metals (such as zinc (Zn), indium (In), gallium (Ga), tin (Sn) cadmium (Cd) or germanium (Ge)) and a combination thereof.

The first gate electrode 214a and the second gate electrode 214b may be formed in a single-layered or a multi-layered structure with one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), by taking into account adhesiveness with a neighboring layer, surface planarization of a stacked layer, and/or the like.

The first gate insulating film 213a may be formed on the buffer layer 211 to cover the first active layer 212a and the second active layer 212b. The second gate insulating film 213b may be formed to cover the first gate electrode 214a and the second gate electrode 214b. The first gate insulating film 213a and the second gate insulating film 213b may include an inorganic film (such as silicon oxide, silicon nitride, or metal oxide) and be formed in a single-layered or a multi-layered structure.

The interlayer insulating layer 215 may be formed on the second gate insulating film 213b. The interlayer insulating layer 215 may include an inorganic film (such as silicon oxide or silicon nitride). In some exemplary embodiments, the interlayer insulating layer 215 may include an organic film.

The first source electrode 216a and the first drain electrode 217a may be formed on the interlayer insulating layer 215. Each of the first source electrode 216a and the first drain electrode 217a may contact the first active layer 212a through a contact opening or hole. The second source electrode 216b and the second drain electrode 217b may be formed on the interlayer insulating layer 215, and each of the second source electrode 216b and the second drain electrode 217b may contact the second active layer 212b through a contact opening or hole.

The first source electrode 216a, the second source electrode 216b, the first drain electrode 217a and the second drain electrode 217b may each be formed in a single-layered or a multi-layered structure with one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A capacitor 230 may store a data signal transmitted to the display portion 200 or compensate for a voltage drop of the display portion 200. For example, the capacitor 230 may include a first capacitor electrode 230a, a second capacitor electrode 230b, and the second gate insulating film 213b between the first capacitor electrode 230a and the second capacitor electrode 230b. The first capacitor electrode 230a may be made of the same material as the second gate electrode 214b, and the second capacitor electrode 230b may be made of the same material as the first gate electrode 214a.

A planarization film 218 may be formed on the interlayer insulating layer 215 to cover the first thin film transistor TFT1, the second thin film transistor TFT2, and the capacitor 230. The planarization film 218 may remove the difference in heights of the interlayer insulating layer so that luminescent efficiency of the organic light-emitting device OLED that will be formed on the planarization film 218 may be improved. Also, the planarization film 218 may have a through hole exposing some portions of the first drain electrode 217a.

The planarization film 218 may be made of an insulating material. For example, the planarization film 218 may have a single-layered or a multi-layered structure formed of an inorganic material, an organic material, or a combination thereof, and may be formed by various suitable depositing methods. In some exemplary embodiments, the planarization film 218 may be formed of one or more materials selected from polyacrylates resin, epoxy resin, phenolic resin, polyamides resin, polyimides rein, unsaturated polyesters resin, poly phenylenethers resin, poly phenylenesulfides resin, and benzocyclobutene (BCB).

The organic light-emitting device OLED may be disposed on the planarization film 218 and include a first electrode 221, an intermediate layer 220 including an organic emission layer, and a second electrode 222.

A pixel defining layer 219 may be formed to cover some portions of the planarization film 218 and the first electrode 221 and to define a pixel region. The pixel defining layer 219 may include an organic insulating film. The organic insulating film may include an acryl-based polymer such as polymethylmethacrylate (PMMA), polystyrene (PS), a polymer derivative having a phenol group, an imide-based polymer, an arylether-based polymer, an amide-based polymer, a fluorine-based polymer, a p-xylene based polymer, a vinyl alcohol-based polymer, or a combination thereof.

Holes and electrons injected from the first electrode 221 and the second electrode 222, of the organic light-emitting device OLED may combine in the organic emission layer of the intermediate layer 220 to generate light.

The intermediate layer 220 may include the organic emission layer. Alternatively, the intermediate layer 220 may include the organic emission layer, and may further include at least one selected from a hole injection layer (HIL), a hole transport layer, an electron transport layer, and an electron injection layer. However, exemplary embodiments are not limited thereto, and the intermediate layer 220 may include various function layers as well as the organic emission layer.

The second electrode 222 may be formed on the intermediate layer 220. The second electrode 222 and the first electrode 221 may generate an electric field to emit light from the intermediate layer 220. The first electrode 221 may be patterned for each of the pixels, and the second electrode 222 may be formed to apply a common voltage to every pixel.

Each of the first electrode 221 and the second electrode 222 may be formed as a transparent electrode or a reflective electrode. The first electrode 221 may serve as an anode electrode, and the second electrode 222 may serve as a cathode electrode, but exemplary embodiments are not limited thereto. For example, the first electrode 221 may serve as the cathode electrode, and the second electrode 222 may serve as the anode electrode.

In FIG. 2, only one organic light-emitting device OLED is illustrated, but the display region AA may include a plurality of organic light-emitting devices OLED wherein each of the organic light-emitting devices OLED may form a pixel, and the pixel may generate red, green, blue, or white light.

A protective layer may also be disposed on the second electrode 222 to cover and protect the organic light-emitting device OLED. The protective layer may be made of an inorganic insulating film and/or an organic insulating film. For example, the protective layer may have a stacked structure in which the organic insulating film and the inorganic insulating film are alternately stacked.

A spacer 223 may be disposed between the substrate 10 and the encapsulation substrate 20 to provide a space between the substrate 10 and the encapsulation substrate 20 so that display characteristics of the organic light-emitting display apparatus 1 may not be deteriorated by external shock.

In some exemplary embodiments, the spacer 223 is disposed on the pixel defining layer 219. The spacer 223 may protrude from the pixel defining layer 219 toward a second substrate 30. In some exemplary embodiments, the pixel defining layer 219 and the spacer 223 may be formed in a single body through a photolithograpy using a photosensitive material. In other words, an amount of exposure may be controlled through an exposure process using a halftone mask to concurrently form the pixel defining layer 219 and the spacer 223.

The second electrode 222 and/or the protective layer may be disposed on the spacer 223.

Circuit patterns 240 and 241 may be formed on the perimeter of the display region AA and include a power line 240 and a connection line 241 that electrically connects the power line 240 to the display portion 200.

The power line 240 may be formed on the interlayer insulating layer 215. The power line 240 may be electrically connected to the second electrode 222 by the connection line 241.

The power line 240 may be a cathode power line ELVSS. When the power line 240 is the cathode power line ELVSS, the cathode power line ELVSS may be connected to a cathode power source having a voltage that is lower than a common power voltage, for example, a ground voltage or a negative voltage.

The sealing portion 300 may couple the substrate 10 to the encapsulation substrate 20 and seal a space between the substrate 10 and the encapsulation substrate 20. Accordingly, the display portion 200 disposed between the substrate 10 and the encapsulation substrate 20 may be protected from external humidity, air, and/or other impurities.

The sealing portion 300 may contain a glass frit and a filler. The glass frit of the sealing portion 300 may be melted and cured by heat to couple the substrate 10 to the encapsulation substrate 20. The glass frit may contain various materials. For example, the glass frit may contain at least vanadium (V) oxide and/or bismuth (Bi) oxide. The glass frit may also contain at least one selected from $TeO_2$, ZnO, BaO, $Nb_2O_5$, $SiO_2$, $Al_2O_3$, $ZrO_2$, and $P_2O_5$.

When a laser beam is irradiated in order to form the sealing portion 300, the filler prevents or inhibits a thermal expansion rate of the sealing portion 300 from increasing and particularly reduces a difference in the thermal expansion rate among the sealing portion 300, the substrate 10, and the encapsulation substrate 20 to effectively couple the sealing portion 300 to the substrate 10 and the encapsulation substrate 20. The filler may contain at least Cr, Cu, and/or Mn. Also, the filler may desirably contain an oxide having a spinel structure. For example, the filler may contain at least $Cu(CrMn)_2O_4$. A Cr component contained in the filler may easily present black color so that an absorption rate of the laser beam for the sealing portion 300 containing the filler may be easily increased.

The sealing portion 300 may be disposed on the interlayer insulating layer 215, and a primary sealing portion in a paste state may be melted and then cured by a laser beam to form the sealing portion 300. When the laser beam is irradiated toward the sealing portion 300 through the encapsulation substrate 20, an area of the primary sealing portion adjacent to the encapsulation substrate 20 is more melted than an area adjacent to the substrate 10. As a result, the sealing portion 300 may have a first width W1 for the area adjacent to the encapsulation substrate 20 and a second width W2 for the area adjacent to the substrate 10, wherein the first width W1 may be greater than the second width W2. The second width (or shorter width) W2 may be defined as an effective width by which the sealing portion 300 is substantially coupled to the substrate 10 and the encapsulation substrate 20. In this regard, as the effective width increases, an adhesion between the substrate 10 and the encapsulation substrate 20 may be improved.

In order to increase the effective width, the sealing portion 300 may be disposed to cover a metal layer 100. The metal layer 100 may be formed on the first gate insulating film 213a.

The metal layer 100 may reflect the laser beam toward the sealing portion 300 to deliver more heat to the primary sealing portion for forming the sealing portion 300. The metal layer 100 may be formed of the same material as the gate electrodes 214a and 214b.

Insulating layers may be formed between the metal layer 100 and the sealing portion 300. The insulating layers may be the second gate insulating film 213b and the interlayer insulating layer 215. A plurality of trenches H1 may be formed in the second gate insulating film 213b and the interlayer insulating layer 215. The trenches H1 may increase a contact area with the sealing portion 300 to improve an adhesion of the sealing portion 300.

The metal layer 100 may include a plurality of openings or holes H2 formed in an area where the trenches H1 are formed. Sizes of the openings or holes H2 may be larger than those of the trenches H1.

The metal layer 100 may be formed on the perimeter of the display region AA and include a first region 110 disposed outside of the display region AA at one side (e.g., one lateral or left side) of the display region AA and a second region 120 disposed outside of the display region AA at another side (e.g., another lateral or right side) of the display region AA, which is opposite to the one side. When the display region AA is in a square form, the first region 110 and the second region 120 may be respectively disposed outside of the display region AA at a left side and a right side of the display region AA. In this regard, the pad PAD may be disposed between the first region 110 and the second region 120 and outside the sealing portion 300.

The first region 110 and the second region 120 of the metal layer 100 may have a different light reflectivity. For example, when the metal layer 100 includes the holes H2, the number of the holes H2 per unit area may differ in the first region 110 and the second region 120. When the first region 110 has more holes H2 per unit area than the second region 120, the light reflectivity of the second region 120 may be greater than that of the first region 110 and thus, the effective width of the sealing portion 300 may be increased in the second region 120. In this regard, the adhesion between the substrate 10 and the encapsulation substrate 20 may be improved (e.g., by reflecting back the laser beam) to increase a mechanical strength of the organic light-emitting display apparatus 1.

Alternatively, in order to differentiate the light reflectivity of the metal layer 100 between the first region 110 and the second region 120, a second metal layer 120b may be further formed on the first region 110 or the second region 120. Referring to FIG. 4, the second metal layer 120b is formed on the second region 120. The second metal layer 120b may contain at least aluminum having an excellent light reflectivity. The second metal layer 120b may be formed of the same material as the source electrodes 216a and 216b and the drain electrodes 217a and 217b. In this regard, the light reflectivity of the second region 120 may be increased to improve the adhesion between the substrate 10 and the encapsulation substrate 20.

Figure 5:
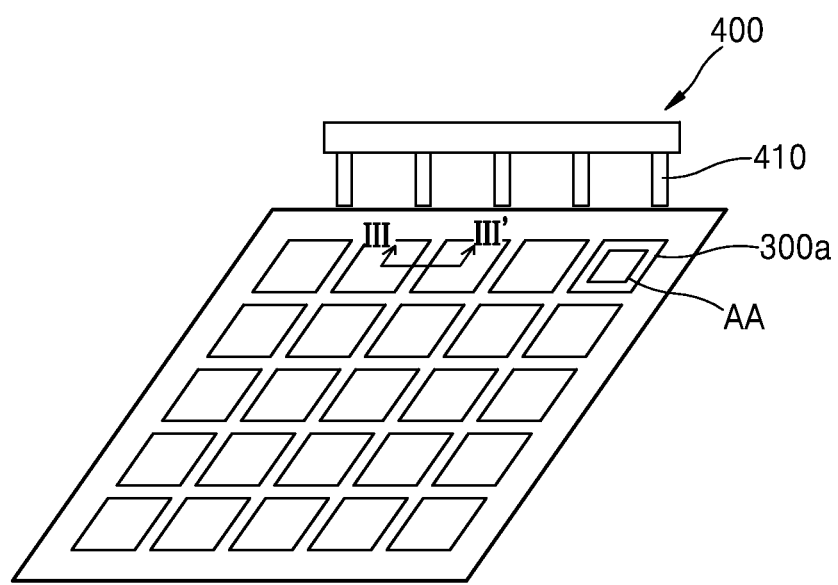
FIG. 5 is a schematic perspective view illustrating a method of manufacturing the display apparatus in FIG. 1.
Figure 6:
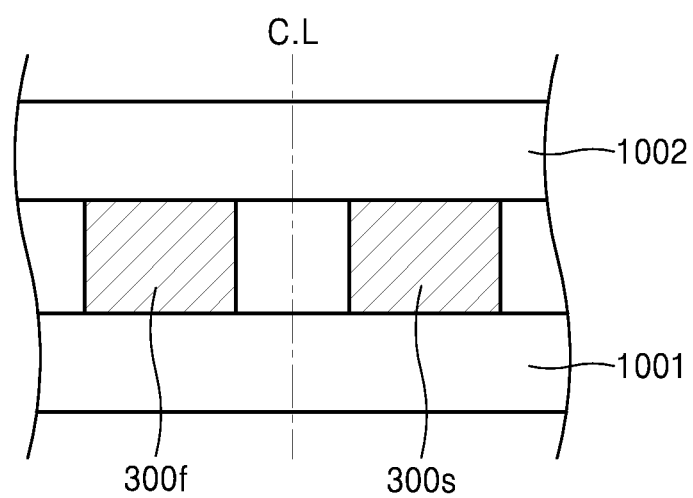
FIG. 6 is a schematic cross-sectional view, taken along a line III-III' of FIG. 5.

FIG. 5 is a schematic perspective view illustrating a method of manufacturing the organic light-emitting display apparatus 1 in FIG. 1, and FIG. 6 is a cross-sectional view taken along a line III-III' in FIG. 5. Hereinafter, the method of manufacturing the organic light-emitting display apparatus 1 will be described with reference to FIGS. 1 to 6.

The method of manufacturing the organic light-emitting display apparatus 1 may include preparing a first mother substrate 1001 and a second mother substrate 1002 disposed to face the first mother substrate 1001, forming a plurality of display portions 200 including the respective display regions AA on the first mother substrate 1001 and the metal layers 100 surrounding the respective display regions AA, coupling the first mother substrate 1001 to the second mother substrate 1002 by using the sealing portions 300 formed to overlap the metal layers 100, and forming a plurality of organic light-emitting display apparatuses 1 by cutting the coupled first mother substrate 1001 and second mother substrate 1002 (the coupled first and second mother substrates 1001 and 1002) along a cutting line C.L.

The first mother substrate 1001 may be made of the same material as the substrate 10, and the second mother substrate 1002 may be the same material as the encapsulation substrate 20.

The display portions 200 may be formed in a planar lattice pattern. The display portions 200 are the same as described in FIG. 2 and thus the detailed description thereof will not be provided again.

The metal layers 100 may be formed to surround the display region AA, and include the first region 110 disposed outside of the display region AA at the one side of the display region AA and the second region 120 disposed outside of the display region AA at the other side of the display region AA, which is opposite to the one side.

The metal layers 100 may have a different light reflectivity in the first region 110 and the second region 120. For example, when the metal layers 100 include a plurality of holes H2, the number of the holes H2 per unit area may differ in the first region 110 and the second region 120. Alternatively, the second metal layer 120b containing at least aluminum may be further formed on the first region 110 or the second region 120. In some embodiments, the second metal layer 120b may be formed of the same material as the source electrodes 216a and 216b and the drain electrodes 217a and 217b.

The sealing portions 300 may be formed to respectively overlap the metal layers 100. Primary (precursor or green) sealing portions 300a in a paste state may be coated at one surface of the first mother substrate 1001 or the second mother substrate 1002 and then, the first mother substrate 1001 and the second mother substrate 1002 are aligned to calcine and dry the primary sealing portions 300a. Next, a laser beam may be irradiated to melt and cure the primary sealing portions 300a, thereby forming the sealing portions 300.

The laser beam may be irradiated to at least two adjacent sealing portions 300 from among the sealing portions 300 at the same time and in the same pattern. For example, a laser output unit 400 may include a plurality of head units 410 corresponding to the sealing portions 300, and the sealing portions 300 may be cured by the head units 410 at the same time and in the same pattern.

Each of the sealing portions 300 may be formed in a closed curve, and the laser output unit 400 may cure the sealing portions 300 by moving in a clockwise or counterclockwise direction. Accordingly, one region of a first region 310 and a second region 320 is firstly irradiated with the laser beam. Thus, the sealing portions 300 may have a fast cure portion 300f overlapping with the one region selected from the first region 310 and the second region 320 and firstly irradiated with the laser beam, which is cured first (cured earlier), and a slow cure portion 300s that is cured later (cured second).

Also, since two adjacent sealing portions 300 may be cured at the same time and in the same pattern, a fast cure portion 300f of one of the two adjacent sealing portions 300 and a slow cure portion 300s of the other of the two adjacent sealing portions 300 may be disposed adjacent to each other, and a cutting line C.L may exist therebetween.

Since the sealing portions 300 are cured differently in the fast cure portion 300f and the slow cure portion 300s in terms of time, non-uniform stress may be generated in regions of the second mother substrate 1002 that contact the fast cure portion 300f and the slow cure portion 300s of the two adjacent sealing portions 300. The region of the second mother substrate 1002 contacting the fast cure portion 300f may have a relatively great stress generated when forming the sealing portion 300, and thus when the coupled first and second mother substrates 1001 and 1002 are cut along the cutting line C.L, the second mother substrate 1002 may have a burr toward the fast cure portion 300f due to residual stress.

Also, the distance between a fast cure portion 300f of one of two adjacent sealing portions 300 and a slow cure portion 300s of the other of two adjacent sealing portions 300 may be relatively small in order to improve a manufacturing yield of the organic light-emitting display apparatus. In this regard, the burr described above may deteriorate the manufacturing yield of the organic light-emitting display apparatus 1, and a further annealing process of the fast cure portion 300f may be needed to prevent or remedy the formation of the burr.

However, according to one or more exemplary embodiments, the metal layer 100 may have a different light reflectivity in the first region 110 and the second region 120, and thus, non-uniform stress in regions of the second mother substrate 1002 that contact the fast cure portion 300f and the slow cure portion 300s may be reduced. In more detail, the light reflectivity of one of the first region 110 and the second region 120, overlapping the fast cure portion 300f may be greater than that of the other region that does not overlap the fast cure portion 300f, and thus, more heat is transmitted to the fast cure portion 300f. In this regard, the fast cure portion 300f is more melted and thus, the stress generated in the region of the second mother substrate 1002 contacting the fast cure portion 300f when forming the sealing portion 300 may also be reduced. Therefore, the non-uniform stress in the regions of the second mother substrate 1002 that contact the fast cure portion 300f and the slow cure portion 300s may be reduced, and the coupled first and second mother substrates 1001 and 1002 may be cut without occurrence of the burr even when the annealing process of the fast cure portion 300f is not performed, thereby improving the manufacturing yield of the organic light-emitting display apparatus 1.

Also, when more heat is transmitted to the fast cure portion 300f, the effective width of the fast cure portion 300f may be increased, and thus the adhesion between the substrate 10 and the encapsulation substrate 20 may be increased, thereby improving the mechanical strength of the organic light-emitting display apparatus 1.

As described above, an adhesion between a substrate and an encapsulation substrate increases and thus, a manufacturing yield of a display apparatus may be increased according to one or more exemplary embodiments.

Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present. As used herein, the terms "use," "using," and "used" may be considered synonymous with the terms "utilize," "utilizing," and "utilized," respectively. Expressions such as "at least one of" or "at least one selected from" when preceding a list of elements, modify the entire list of elements and do not modify the individual elements of the list.

Sizes of elements may be exaggerated for convenience of explanation. In other words, since sizes and shapes of elements in the drawings are arbitrarily illustrated for convenience of explanation, the exemplary embodiments are not limited thereto. While one or more exemplary embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
a substrate;
an encapsulation substrate facing the substrate;
a display portion between the substrate and the encapsulation substrate and having a display region to display an image;
a metal layer on the substrate and surrounding the display region; and
a sealing portion overlapping the metal layer and coupling the substrate to the encapsulation substrate;
wherein the metal layer comprises a first region outside of the display region and extending along an entirety of one side of the display region and a second region outside of the display region and extending along an entirety of another side of the display region, which is opposite to the one side,
wherein a light reflectivity of an entirety of the first region of the metal layer is different than a light reflectivity of an entirety of the second region of the metal layer,
wherein a width of each of the first region and the second region is the same as a width of the metal layer,
wherein an area of the first region is the same as an area of the second region,
wherein the metal layer comprises a plurality of holes, and
wherein a total number of holes in the area of the first region is different than a total number of holes in the area of the second region.

2. The display apparatus of claim 1, further comprising an insulating layer between the metal layer and the sealing portion,
wherein the insulating layer comprises a plurality of trenches overlapping the plurality of holes.

3. The display apparatus of claim 1, further comprising a second metal layer on the first region or the second region.

4. The display apparatus of claim 3, wherein
the second metal layer comprises at least aluminum.

5. The display apparatus of claim 4, wherein
the display portion comprises a display device and a thin film transistor electrically connected to the display device, wherein
the thin film transistor comprises an active layer, a gate electrode, a source electrode and a drain electrode, and
the second metal layer is formed of the same material as the source electrode and the drain electrode.

6. The display apparatus of claim 5, wherein
the display device comprises a first electrode, a second electrode, and an organic emission layer between the first electrode and the second electrode.

7. The display apparatus of claim 1, wherein
the display portion comprises a pad configured to apply an electrical signal to the display region, and
the pad is between the first region and the second region and outside the sealing portion.

8. The display apparatus of claim 1, wherein
an effective width of the sealing portion in each of the first region and the second region differs.

9. A display apparatus comprising:
a substrate;
an encapsulation substrate facing the substrate;
a display portion between the substrate and the encapsulation substrate and having a display region to display an image;
a metal layer on the substrate and surrounding the display region, the metal layer comprises a plurality of holes; and
a sealing portion overlapping the metal layer and coupling the substrate to the encapsulation substrate;
wherein the metal layer comprises a first region outside of the display region and extending along an entirety of one side of the display region and a second region outside of the display region and extending along an entirety of another side of the display region, which is opposite to the one side,
wherein a width of each of the first region and the second region is the same as a width of the metal layer,
wherein a length of each of the first region and the second region is the same, and
wherein a total number of holes in the first region is different than a total number of holes in the second region.

10. The display apparatus of claim 9, further comprising an insulating layer between the metal layer and the sealing portion,
wherein the insulating layer comprises a plurality of trenches overlapping the plurality of holes.

11. The display apparatus of claim 1, wherein an effective width of the sealing portion in each of the first region and the second region differs.

\* \* \* \* \*